US009147782B2

(12) United States Patent
Estevez-Garcia et al.

(10) Patent No.: US 9,147,782 B2
(45) Date of Patent: Sep. 29, 2015

(54) OPTOELECTRONIC TRANSMISSION SYSTEM AND METHOD

(71) Applicant: Infineon Technologies AG, Neubiberg (DE)

(72) Inventors: Jaime Estevez-Garcia, Munich (DE); Josef-Paul Schaffer, Bruckmuehl (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/185,372

(22) Filed: Feb. 20, 2014

(65) Prior Publication Data

US 2014/0167090 A1    Jun. 19, 2014

Related U.S. Application Data

(63) Continuation of application No. 12/704,021, filed on Feb. 11, 2010, now Pat. No. 8,693,883.

(30) Foreign Application Priority Data

Feb. 17, 2009   (DE) .......................... 10 2009 009 316

(51) Int. Cl.
| | | |
|---|---|---|
| H04B 10/00 | (2013.01) | |
| H01L 31/0232 | (2014.01) | |
| H01L 31/105 | (2006.01) | |
| H01L 31/11 | (2006.01) | |
| H01L 31/111 | (2006.01) | |
| H01L 31/167 | (2006.01) | |
| H01L 31/173 | (2006.01) | |
| H01L 33/58 | (2010.01) | |

(52) U.S. Cl.
CPC ...... *H01L 31/02327* (2013.01); *H01L 31/0232* (2013.01); *H01L 31/105* (2013.01); *H01L 31/1105* (2013.01); *H01L 31/1113* (2013.01); *H01L 31/167* (2013.01); *H01L 31/173* (2013.01); *H01L 33/58* (2013.01)

(58) Field of Classification Search
CPC .. H04B 10/43; H04B 10/614; H04B 10/6151; H04B 10/675; H04B 31/0232; H04B 31/167; H04B 33/58
See application file for complete search history.

(56) References Cited

U.S. PATENT DOCUMENTS 3,735,266 A   5/1973   Amitay
5,753,929 A   5/1998   Bliss
(Continued)

FOREIGN PATENT DOCUMENTS

EP   1887634 A2   2/2008
JP   6242471 A    2/1987

*Primary Examiner* — Dzung Tran
(74) *Attorney, Agent, or Firm* — Shumaker & Sieffert, P.A.

(57) ABSTRACT

An optoelectronic transmission system has a photoemitter semiconductor component and a photodetector semiconductor component. The photoemitter semiconductor component has a radiation source for converting a first electrical signal into a first electromagnetic radiation and a first polarization filter having a first polarization direction for filtering the first electromagnetic radiation. The photodetector semiconductor component has a second polarization filter having a second polarization direction for filtering a second electromagnetic radiation and a sensor element for converting a second electromagnetic radiation which has been polarized by the polarization filter into a second electrical signal. In this case, the first polarization direction of the first polarization filter is identical to the second polarization direction of the second polarization filter.

19 Claims, 3 Drawing Sheets

(56) References Cited

U.S. PATENT DOCUMENTS

| | | | |
|---|---|---|---|
| 2001/0012142 A1* | 8/2001 | Carlson | 359/159 |
| 2001/0035492 A1 | 11/2001 | Estevez-Garcia | |
| 2002/0088927 A1* | 7/2002 | Simchoni | 250/225 |
| 2005/0036740 A1* | 2/2005 | Itabashi et al. | 385/50 |
| 2008/0122803 A1* | 5/2008 | Izadi et al. | 345/175 |
| 2010/0118398 A1* | 5/2010 | Grau | 359/465 |

* cited by examiner

OPTOELECTRONIC TRANSMISSION SYSTEM AND METHOD

This is a Continuation of application Ser. No. 12/704,021, filed on Feb. 11, 2010 which claims priority to German Patent Application No. DE102009009316.8, filed Feb. 17, 2009, the content of each of which are hereby incorporated by reference.

FIELD OF INVENTION

The present invention relates to a photodetector semiconductor component, a photoemitter semiconductor component, an optoelectronic transmission system, and a method for transmitting an electrical signal.

BACKGROUND

In many applications, it is necessary for electric circuits to be electrically isolated. Such electric circuits can be electrically isolated from one another by optocouplers, for example. Optocouplers are semiconductor components which perform an electrical-optical-electrical conversion of a signal. They have at least one radiation emitter and one radiation receiver which are coupled via an optical transmission link. The transmission link can be the free space or a wave-guiding system, for example glass, plastic or an optical waveguide.

SUMMARY

In one embodiment, an optoelectronic transmission system comprises a photoemitter semiconductor component, which has a radiation source for converting a first electrical signal into a first electromagnetic radiation, and a photodetector semiconductor component, which has a sensor element for converting a second electromagnetic radiation into a second electrical signal. The photoemitter semiconductor component furthermore has a first polarization filter having a first polarization direction, which filters the first electromagnetic radiation, and the photodetector semiconductor component furthermore has a second polarization filter having a second polarization direction, which filters the second electromagnetic radiation before it impinges on the sensor element. The first polarization direction of the first polarization filter is identical to the second polarization direction of the second polarization filter.

DETAILED DESCRIPTION

Exemplary embodiments are explained in greater detail below, with reference to the accompanying figures. However, the invention is not restricted to the embodiments specifically described, but rather can be modified and altered in a suitable manner. It lies within the scope of the invention to suitably combine individual features and feature combinations of one embodiment with features and feature combinations of another embodiment in order to arrive at further embodiments according to the invention.

Figure 1:
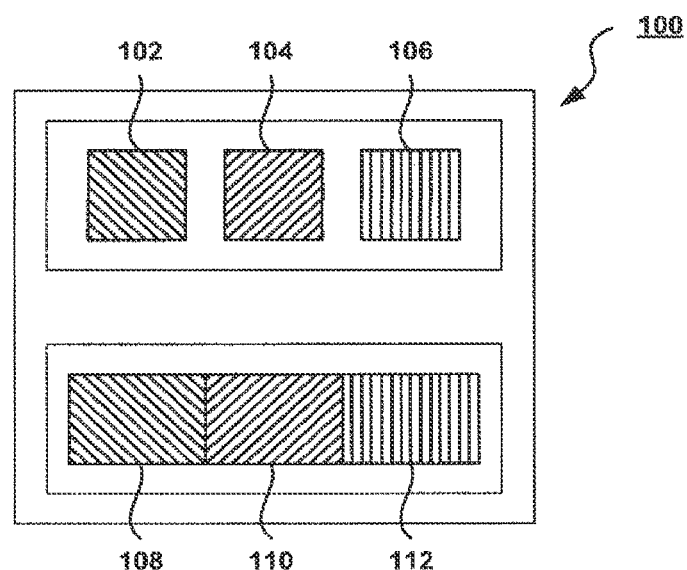
FIG. 1 shows a schematic illustration of an embodiment of an optoelectronic transmission system according to the invention.

FIG. 1 shows a schematic illustration of an embodiment of an optoelectronic transmission system according to the invention. On the emission side, the optoelectronic transmission system 100 comprises a first photoemitter semiconductor component 102, a second photoemitter semiconductor component 104 and a third photoemitter semiconductor component 106. On the receiver side, the optoelectronic transmission system 100 comprises a first photodetector semiconductor component 108, a second photodetector semiconductor component 110 and a third photodetector semiconductor component 112.

Each of the photoemitter semiconductor components 102, 104, 106 respectively converts an electrical signal into an electromagnetic radiation and emits the latter. The electromagnetic radiation is received by the photodetector semiconductor components 108, 110, 112 and converted there by each photodetector semiconductor component 108, 110, 112 respectively into a further electrical signal. Consequently, a parallel transmission of three electrical signals by means of polarized electromagnetic radiation takes place in the optoelectronic transmission system 100.

Each of the photoemitter semiconductor components 102, 104, 106 comprises a polarization filter, wherein the polarization directions of the polarization filters of the photoemitter semiconductor components 102, 104, 106 differ from one another. The polarization filter has the effect that only an electromagnetic radiation having a predetermined polarization direction is emitted by the photoemitter semiconductor component. The predetermined polarization direction is predefined by the polarization filter. The emitted electromagnetic radiation can be distinguished, on account of its predetermined polarization direction, from an interference radiation which is superposed with the electromagnetic radiation during a transmission and whose polarization direction does not correspond to the predetermined polarization direction. What is made possible as a result is that the emitted electromagnetic radiation, after transmission, can again be securely and reliably converted back into an electrical signal, even if an interference radiation occurs during transmission.

In FIG. 1, the different polarization directions are illustrated schematically by hatchings of the photoemitter semiconductor components 102, 104, 106. As shown in FIG. 1, by way of example, the polarization direction of the first photoemitter semiconductor component 102 is rotated by 135° with respect to the horizontal axis, the polarization direction of the second photoemitter semiconductor component 104 is rotated by 45° with respect to the horizontal axis, and the polarization direction of the third photoemitter semiconductor component 106 is rotated by 90° with respect to the horizontal axis. However, other values of the rotation are also possible. By way of example, the polarization direction of the first photoemitter semiconductor component 102 is rotated by 0° with respect to the horizontal axis, the polarization direction of the second photoemitter semiconductor component 104 is rotated by 60° with respect to the horizontal axis, and the polarization direction of the third photoemitter semiconductor component 106 is rotated by 120° with respect to the horizontal axis.

An unambiguous assignment of the polarized electromagnetic radiation to the photoemitter semiconductor components 102, 104, 106 is possible on account of the different polarization directions. Moreover, an interference radiation whose polarization direction does not correspond to any of the polarization directions of the photoemitter semiconductor components 102, 104, 106 can be distinguished.

Each of the photodetector semiconductor components 108, 110, 112 likewise comprises a polarization filter, wherein the polarization directions of the polarization filters of the photodetector semiconductor components 108, 110, 112 differ from one another. The polarization filter has the effect that only an electromagnetic radiation having a predetermined polarization direction reaches the sensor element and is converted into an electrical signal by the sensor element. The predetermined polarization direction is predefined by the polarization filter. An electromagnetic radiation whose polarization direction does not correspond to the predetermined polarization direction is filtered out by the polarization filter and does not pass to the sensor element. An undesired interference radiation whose polarization direction does not correspond to the predetermined polarization direction is thus prevented from reaching the sensor element. Consequently, the conversion into the electrical signal is not impaired by the interference radiation either. The electromagnetic radiation received by the photodetector semiconductor component is thus securely and reliably converted into the electrical signal.

As illustrated schematically by hatchings in FIG. 1, in this case the polarization directions of the photodetector semiconductor components 108, 110, 112 respectively correspond to a polarization direction of one of the photoemitter semiconductor components 102, 104, 106. By way of example, the first photodetector semiconductor component 108 has the same polarization direction as the first photoemitter semiconductor component 102, the second photodetector semiconductor component 110 has the same polarization direction as the second photoemitter semiconductor component 104, and the third photodetector semiconductor component 112 has the same polarization direction as the third photoemitter semiconductor component 106.

A photoemitter semiconductor component forms together with a photodetector semiconductor component a transmission channel for an electrical signal, where the photoemitter semiconductor component and the photodetector semiconductor component have the same polarization direction. By way of example, the first photoemitter semiconductor component 102 and the first photodetector semiconductor component 108 form a first transmission channel, the second photoemitter semiconductor component 104 and the second photodetector semiconductor component 110 form a second transmission channel, and the third photoemitter semiconductor component 106 and the third photodetector semiconductor component 112 form a third transmission channel. The polarization filters of the photoemitter semiconductor components 102, 104, 106 and of the photodetector semiconductor components 108, 110, 112 bring about channel separation and crosstalk between the transmission channels is prevented on account of the different polarization directions. Moreover, an interference radiation whose polarization direction differs from the polarization directions of the transmission channels has no influence on the transmission. Consequently, the optoelectronic transmission system 100 enables reliable parallel transmission of electrical signals. An identical polarization direction of the first and second polarization filters has the effect that the first electromagnetic radiation emitted by the photoemitter semiconductor component can be received by the photodetector semiconductor component and converted into the further electrical signal. An interference radiation which occurs during transmission of the first electromagnetic radiation from the photoemitter semiconductor component to the photodetector semiconductor component and the polarization direction of which does not correspond to the first or second polarization direction is filtered out by the second polarization filter. Consequently, the interference radiation does not reach the sensor element and has no influence on the conversion of the second electromagnetic radiation received by the photodetector semiconductor component into the second electrical signal.

As illustrated in FIG. 1, the photodetector semiconductor components 108, 110, 112 can be arranged in a manner directly adjoining one another. By way of example, the photodetector semiconductor components 108, 110, 112 are monolithically integrated. No structural measures such as, for example, partitions or spatial separation between the photodetector semiconductor components 108, 110, 112 are required to avoid crosstalk. A compact and space-saving arrangement of the photodetector semiconductor components 108, 110, 112 within the optoelectronic transmission system 100 is thus made possible.

The photoemitter semiconductor components 102, 104, 106 are arranged in a manner spaced apart from one another, for example, as shown in FIG. 1. Each photoemitter semiconductor component 102, 104, 106 is integrated into a separate chip housing, for example, wherein the chip housings are arranged on a common carrier. However, the photoemitter semiconductor components 102, 104, 106 can also be arranged in a common chip housing in a manner directly adjoining one another on a carrier. The photoemitter semiconductor components 102, 104, 106 can also be monolithically integrated.

Since no structural measures for separating the photoemitter semiconductor components 102, 104, 106 or the photodetector semiconductor components 108, 110, 112 are required, the dimensions and the form of the photoemitter semiconductor components 102, 104, 106 and of the photodetector semiconductor components 108, 110, 112 can be chosen as desired. The photoemitter semiconductor components 102, 104, 106 and the photodetector semiconductor components 108, 110, 112 can thus be simply adapted and integrated into an existing design. As illustrated in FIG. 1, the photoemitter semiconductor components 102, 104, 106 and the photodetector semiconductor components 108, 110, 112 can have a square form. However, rectangular forms or n-gonal forms having more or fewer than four corners are also possible. In this case, the photoemitter semiconductor components 102, 104, 106 and the photodetector semiconductor components 108, 110, 112 do not all have to have the same form.

The optoelectronic transmission system 100 illustrated in FIG. 1 is a multichannel optocoupler, for example, which transmits a plurality of electrical signals in parallel from an input circuit to an output circuit, wherein the input circuit is electrically decoupled from the output circuit. The multichannel optocoupler is integrated in a chip housing, for example, wherein the photoemitter semiconductor components 102, 104, 106 and the photodetector semiconductor components 108, 110, 112 are arranged on a common carrier.

The optoelectronic transmission system is suitable for secure and reliable transmission of an electrical signal from a first circuit to a second circuit. The electrical signal generated by the first circuit is converted into an electromagnetic radiation having a predetermined polarization direction by the photoemitter semiconductor component. The transmission to the second circuit takes place by means of the polarized electromagnetic radiation. The photodetector semiconductor component receives the electromagnetic radiation and converts it into a further electrical signal. The further electrical signal is provided to the second circuit and corresponds to the electrical signal generated by the first circuit. The photodetector semiconductor component is constructed in such a way that it only converts an electromagnetic radiation whose polarization direction corresponds to the predetermined polarization direction. A radiation which is superposed with the polarized electromagnetic radiation during transmission and the polarization direction of which differs from the predetermined polarization direction is filtered out in the photodetector semiconductor component and therefore does not reach the sensor element. Consequently, the optoelectronic transmission system is robust with respect to an interference radiation which occurs during transmission, and enables reliable transmission of an electrical signal independently of interfering influences from the environment.

Figure 2:
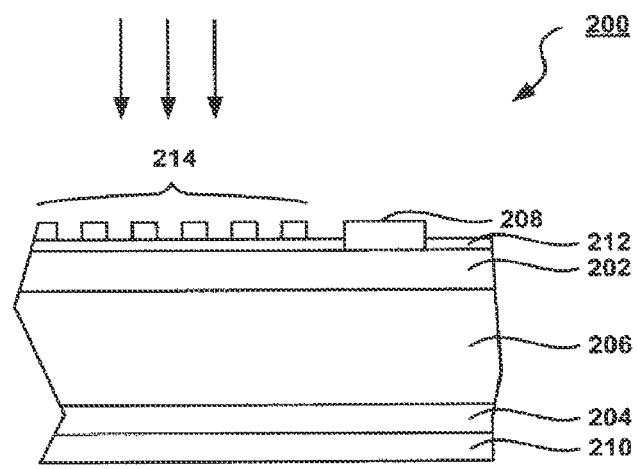
FIG. 2 shows a schematic illustration of an embodiment of a cross section of a photodiode for an optocoupler in which a plurality of strips is formed in a metallization plane.

FIG. 2 shows a schematic illustration of an embodiment of a cross section of a photodiode for an optocoupler in which a plurality of strips is formed in a metallization plane. The photodiode 200 is a PIN photodiode having a P-type layer 202, an N-type layer 204 and an I-type layer 206 arranged between the P-type layer 202 and the N-type layer 204. The P-type layer 202 is formed from a p+-doped region connected to an anode contact 208. The N-type layer 204 is formed from an n+-doped region connected to a cathode contact 210. The anode contact 208 and the cathode contact 210 contain aluminium or gold, for example. A coating layer 212, containing silicon nitride, for example, is arranged on the P-type layer 202.

A plurality of strips 214 is arranged in a metallization plane of the photodiode 200. The plurality of strips 214 is formed above the P-type layer 202, which forms an anode region of the photodiode 200. The strips 214 are arranged for example in the same metallization plane as the anode contact 208 and contain for example the same material as the anode contact 208. The metallization plane can be for example a wiring plane of a semiconductor component into which the photodiode 200 is integrated. The strips 214 can be produced simply and cost-effectively in a standard semiconductor production process. No special process options or special structure sizes are required.

The plurality of strips 214 forms a polarization filter, wherein the strips 214 are arranged parallel to one another in a plane, the width of all the strips 214 is the same and the distance between all the strips 214 is the same. An electromagnetic radiation (indicated by arrows in FIG. 2) is filtered by the polarization filter before it impinges on the anode region of the photodiode 200. As a result, only a radiation having a specific polarization direction is converted into an electrical signal by the photodiode 200, which electrical signal can be tapped off at the anode contact 208 and at the cathode contact 210.

Figure 3:
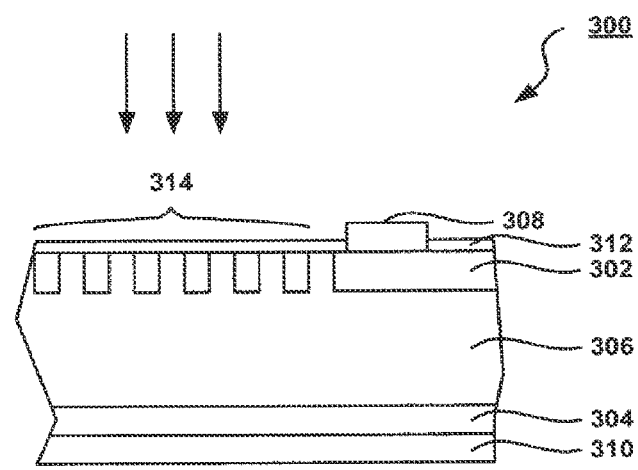
FIG. 3 shows a schematic illustration of an embodiment of a cross section of a photodiode for an optocoupler in which a plurality of strips is formed in a doped region.

FIG. 3 shows a schematic illustration of an embodiment of a cross section of a photodiode for an optocoupler in which a plurality of strips is formed in a doped region. In a manner similar to the photodiode 200 from FIG. 2, the photodiode 300 is a PIN photodiode having a P-type layer 302, an N-type layer 304 and an I-type layer 306 arranged between the P-type layer 302 and the N-type layer 304. The P-type layer 302 is formed from a p+-doped region connected to an anode contact 308. The N-type layer 304 is formed from an n+-doped region connected to a cathode contact 310. The anode contact 308 and the cathode contact 310 contain aluminium or gold, for example. A coating layer 312, containing silicon nitride, for example, is arranged on the P-type layer 302.

In the same way as in FIG. 2, the photodiode 300 comprises a plurality of strips 314 forming a polarization filter. In contrast to FIG. 2, in Figure the plurality of strips 314 is formed by a structuring of the p+-doped region 302. The strips 314 are p+-doped partial regions which run parallel to one another. In one embodiment, the strips 314 are interconnected within the P-type layer 302. Furthermore, the strips 314 can also be connected to the anode contact 308 within the P-type layer 302. In this case, the strips 314 simultaneously form a polarization filter and an anode region of the photodiode 300.

Figure 4:
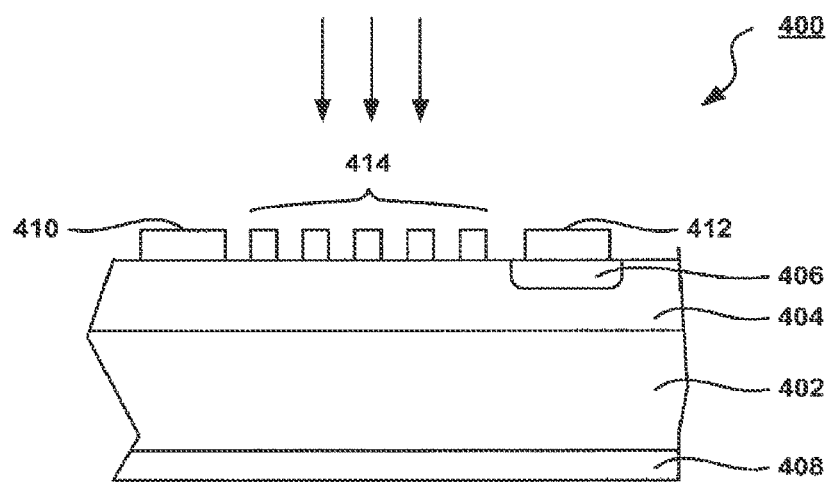
FIG. 4 shows a schematic illustration of an embodiment of a cross section of a phototransistor for an optocoupler in which a plurality of strips is formed in a metallization plane.

FIG. 4 shows a schematic illustration of an embodiment of a cross section of a phototransistor for an optocoupler in which a plurality of strips is formed in a metallization plane. The phototransistor 400 is an npn transistor having a semiconductor substrate 402 of the n− conduction type connected to a collector contact 408. A p−-doped region 404 is introduced into the semiconductor substrate 402, and is connected to a base contact 410. An n+-doped region 406 is introduced into the p−-doped region 404, and is connected to an emitter contact 412.

A plurality of strips 414 is arranged in a metallization plane of the phototransistor 400. The plurality of strips 414 is formed above the p−-doped region 404, which forms a base region of the phototransistor 400. The strips 414 are arranged for example in the same metallization plane as the base contact 410 and the emitter contact 412 and contain for example the same material as the base contact 410 and the emitter contact 412. The metallization plane can be for example a wiring plane of a semiconductor component into which the phototransistor 400 is integrated. The strips 414 can thus be produced simply and cost-effectively in a standard semiconductor production process. No special process options or special structure sizes are required.

The plurality of strips 414 forms a polarization filter, wherein the strips 414 are arranged parallel to one another in a plane, the width of all the strips 414 is the same and the distance between all the strips 414 is the same. An electromagnetic radiation (indicated by arrows in FIG. 4) is filtered by the polarization filter before it impinges on the base region of the phototransistor 400. As a result, only a radiation having a specific polarization direction is converted into an electrical signal by the phototransistor 400, which electrical signal can be tapped off at the collector contact 408 and at the emitter contact 412.

In one embodiment, the polarization filter of the phototransistor comprises, in a manner similar to the photodiode 300 shown in FIG. 3, a plurality of strips which are arranged parallel to one another and which are formed in the p−-doped base region of the phototransistor.

In one embodiment, the strips 214, 314, 414 which are arranged parallel to one another and are shown in FIG. 2, FIG. 3 and FIG. 4 are connected to one another. By way of example, the strips 214, 314, 414 form a meandering form. As an alternative, a ring can be formed within the metallization plane or within the doped region 302 around the strips 214, 314, 414, said ring being connected to the ends of the strips 214, 314, 414 and thus providing for an interconnection of the strips 214, 314, 414.

In the case of the embodiments illustrated in FIG. 2 and FIG. 4, the plurality of strips 214, 414 are arranged in a metallization plane. In another embodiment, the strips 214, 414 are formed in a polysilicon plane. In a further embodiment, the strips 214, 414 are formed in a plurality of planes, these planes comprising a metallization plane and/or a polysilicon plane. The strips run parallel to one another in each plane and the strips of the different planes all extend in the same longitudinal direction. The strips of the different planes can be arranged in a manner offset with respect to one another in the transverse direction, such that the filter properties of the polarization filter are determined by the distance between the strips of the different planes.

In a manner similar to the embodiments illustrated in FIG. 2, FIG. 3 and FIG. 4, a photothyristor which can be used in an optocoupler can comprise a polarization filter. The polarization filter is formed in a region of a gate of the photothyristor and comprises a plurality of strips arranged parallel to one another, which is arranged in a doped region, in a metallization plane and/or a polysilicon plane. The photothyristor converts an electromagnetic radiation having a specific polarization direction into an electrical signal which can be tapped off at an anode contact and a cathode contact of the photothyristor.

A light-emitting diode for an optocoupler, which converts an electrical signal into an electromagnetic radiation, can comprise a polarization filter constructed in a manner corresponding to one of the polarization filters illustrated in FIG. 2, FIG. 3 and FIG. 4. The polarization filter has the effect that the light-emitting diode emits an electromagnetic radiation having a predetermined polarization direction. The light-emitting diode comprises gallium arsenide, for example, and emits in the infrared range.

The embodiments of a photodiode 200, 300, of a phototransistor 400 and of a photothyristor as described with reference to FIG. 2, FIG. 3 and FIG. 4 are examples of a photodetector semiconductor component which can be used in an optocoupler. The embodiment of a light-emitting diode as described with reference to FIG. 2, FIG. 3 and FIG. 4 is an example of a photoemitter semiconductor component which can be used in an optocoupler. The photodiode 200, 300, the phototransistor 400, the photothyristor and the light-emitting diode can be used as photodetector semiconductor component 108, 110, 112 and as photoemitter semiconductor component 102, 104, 106, respectively, in an optoelectronic transmission system 100 illustrated in FIG. 1. The optoelectronic transmission system is a multichannel optocoupler, for example, wherein each transmission channel has a different polarization direction. A photoemitter semiconductor component forms together with a photodetector semiconductor component a respective transmission channel, wherein a polarization filter of the photoemitter semiconductor component has the same polarization direction as a polarization filter of the photodetector semiconductor component.

In one embodiment, the photodetector semiconductor components 108, 110, 112 and the photoemitter semiconductor components 102, 104, 106 are integrated into a common chip housing. In an alternative embodiment, the photodetector semiconductor components 108, 110, 112 are arranged in separate chip housings, and the photoemitter semiconductor components 102, 104, 106 are also arranged in separate chip housings. In this case, a different polarization direction can be achieved by the chip housings of the photoemitter semiconductor components 102, 104, 106 being arranged in a manner rotated with respect to one another. The chip housings of the photodetector semiconductor components 108, 110, 112 are likewise arranged in a manner rotated with respect to one another, wherein the rotation of one of the chip housings of the photodetector semiconductor components 108, 110, 112 respectively corresponds to the rotation of one of the chip housings of the photoemitter semiconductor components 102, 104, 106.

Figure 5:
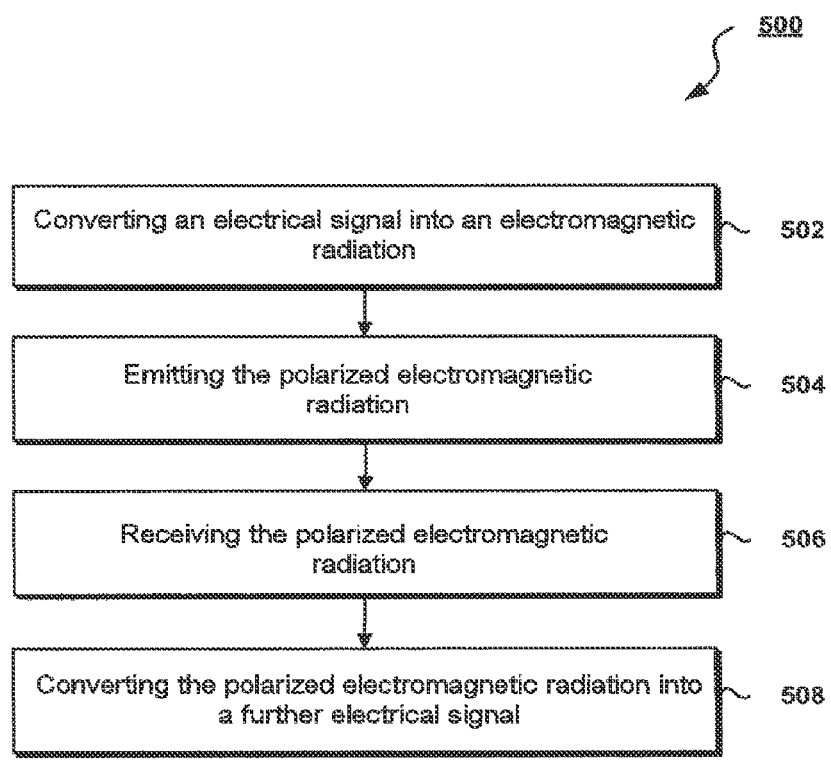
FIG. 5 shows a flowchart of a method for transmitting an electrical signal from a first circuit to a second circuit.

FIG. 5 shows a flowchart of a method 500 for transmitting an electrical signal from a first circuit to a second circuit.

In 502, the electrical signal is converted into an electromagnetic radiation.

In 504, the electromagnetic radiation is polarized in a predetermined polarization direction and emitted.

In 506, the polarized electromagnetic radiation is received. In this case, an electromagnetic radiation whose polarization direction does not correspond to the predetermined polarization direction is filtered out.

In 508, the polarized electromagnetic radiation is converted into a further electrical signal. In this case, the further electrical signal corresponds to the signal which was converted into the electromagnetic radiation in 502.

The method 500 enables secure transmission of the electrical signal from a first circuit to a second circuit. An interference radiation which is superposed with the polarized electromagnetic radiation during transmission and the polarization direction of which does not correspond to the predetermined polarization direction has no influence on the transmission since this interference radiation is filtered out.

The method 500 can be used to transmit a plurality of electrical signals in parallel, wherein each electrical signal is converted into an electromagnetic radiation having a predetermined polarization direction. In this case, crosstalk can be avoided by virtue of a different polarization direction of the electromagnetic radiation being chosen for each electrical signal.

In the method, the electrical signal is reliably transmitted from the first circuit to the second circuit by means of the electromagnetic radiation. An interference radiation which is superposed with the electromagnetic radiation and the polarization direction of which differs from the predetermined polarization direction is filtered out and therefore has no influence on the transmission of the electrical signal. Consequently, the method enables secure transmission of the electrical signal in an environment in which interference occurs.

The devices of methods illustrated with reference to FIGS. 1-5 can be used to transmit information from one electrical potential of a first circuit to another electrical potential of a second circuit, while the two circuits are electrically isolated from one another. The information can comprise analogue or digital electrical signals. Such electrical isolation is employed for example in the field of power supply in the case of switched-mode power supplies, in the field of data transmission, for example in the case of telecommunications or in the case of EDP applications, in the field of control, for example in the case of industrial applications or in the automotive sector, or in the field of ESD protection circuits, for example for medical applications.

There are various configurations and developments of the embodiments:

In one configuration of the photodetector semiconductor component, the polarization filter comprises a plurality of strips which are arranged parallel to one another and at an identical distance from one another. In this case, the position or orientation of the strips defines the polarization direction of the polarization filter. The plurality of strips can be arranged in a plane. By way of example, the plurality of strips is formed in a metallization plane on or above a semiconductor substrate of the photodetector semiconductor component. The metallization plane is a wiring plane of the semiconductor component, for example. As an alterative, the plurality of strips are formed in doped regions of the semiconductor substrate. The plurality of strips can thus be produced simply and cost-effectively in a standard semiconductor production process. No special process steps are necessary for forming the plurality of strips.

In a further configuration of the photodetector semiconductor component, the sensor element is embodied as a photodiode and the plurality of strips is arranged in a region of an anode of the photodiode in such a way that an electromagnetic radiation impinging on the anode is filtered by the plurality of strips. The polarization filter can be added to an existing design of a photodiode by the plurality of strips being arranged within the anode. In this case, the dimensions of the photodiode do not have to be enlarged. The polarization filter can thus be integrated into an existing design of a photodiode in a neutral manner in respect of area.

In another configuration of the photodetector semiconductor component, the sensor element is embodied as a phototransistor and the plurality of strips is arranged in a region of a base of the phototransistor in such a way that an electromagnetic radiation impinging on the base is filtered by the plurality of strips. The polarization filter can be added to an existing design of a phototransistor by the plurality of strips being arranged within the base. In this case, the dimensions of the phototransistor do not have to be enlarged. The polarization filter can thus be integrated into an existing phototransistor in a neutral manner in respect of area.

One development of the photodetector semiconductor component comprises a further polarization filter and a further sensor element, wherein a first polarization direction of the polarization filter differs from a second polarization direction of the further polarization filter. This photodetector semiconductor component is suitable for use in a multichannel optocoupler, wherein crosstalk between the channels is prevented by virtue of the polarization direction of the polarization filters being different and only electromagnetic radiation with a specific polarization direction reaching the respective sensor element.

In one configuration of the photodetector semiconductor component, the sensor element and the further sensor element are arranged on a carrier in a manner directly adjoining one another. Crosstalk is avoided by virtue of only an electromagnetic radiation with a predetermined polarization direction being fed to the respective sensor element, wherein the polarization direction of each sensor element is different. Consequently, no elements or structural measures which prevent crosstalk have to be provided between the sensor elements, rather the sensor element and the further sensor element can be arranged on a carrier in a space-saving manner.

In one configuration of the photodetector semiconductor component, the sensor element, the polarization filter, the further sensor element and the further polarization filter are arranged in a chip housing.

In one configuration of the photoemitter semiconductor component, the radiation source is embodied as a light-emitting diode. By way of example, the photoemitter semiconductor component comprises an infrared-emitting diode having a high efficiency.

In one configuration of the photoemitter semiconductor component, the polarization filter comprises a plurality of strips which are arranged parallel to one another and at an identical distance from one another. The plurality of strips can be arranged in a plane. The position or the orientation of the strips in this case determines the polarization direction of the polarization filter.

One development of the photoemitter semiconductor component comprises a further polarization filter and a further radiation source, wherein a first polarization direction of the polarization filter differs from a second polarization direction of the further polarization filter. This photoemitter semiconductor component is suitable for use in a multichannel optocoupler, wherein crosstalk between the channels is prevented by virtue of the polarization direction of the polarization filters being different. On account of the different polarization directions, a radiation of the radiation source can be distinguished from a radiation of the further radiation source.

In one configuration of the photoemitter semiconductor component, the radiation source, the polarization filter, the further radiation source and the further polarization filter are arranged in a chip housing.

One development of the optoelectronic transmission system comprises a further photodetector semiconductor component and a further photoemitter semiconductor component, wherein a third polarization direction of the further photodetector semiconductor component is identical to a fourth polarization direction of the further photoemitter semiconductor component, and wherein the first and second polarization directions differ from the third and fourth polarization directions. The optoelectronic transmission system thus comprises two transmission channels, wherein the photodetector semiconductor component and the photoemitter semiconductor component form a first transmission channel, and wherein the further photodetector semiconductor component and the further photoemitter semiconductor component form a second transmission channel. The electromagnetic radiation of the two transmission channels has a predetermined polarization direction, wherein the polarization direction of the first transmission channel differs from the polarization direction of the second transmission channel. Since each transmission channel operates with its own polarization direction, crosstalk between transmission channels is prevented. Consequently, a plurality of electrical signals can be transmitted in parallel in a secure and reliable manner.

In one configuration, the optoelectronic transmission system is arranged in a chip housing. In an alternative embodiment, the photodetector semiconductor component and the photoemitter semiconductor component are arranged in separate chip housings.

In one configuration, the optoelectronic transmission system is a multichannel optocoupler and a plurality of electrical signals are transmitted in parallel from a first circuit to a second circuit, wherein the circuits are electrically isolated from one another.

The invention claimed is:

1. A photodetector semiconductor component for an optoelectronic transmission system, the photodetector semiconductor component comprising:
   a first polarization filter for filtering electromagnetic radiation received from a second filter of a photoemitter semiconductor component of the optoelectronic transmission system, wherein:
      the first polarization filter has a first polarization direction for filtering the electromagnetic radiation received from the second filter of the photoemitter semiconductor component; and
      the first polarization direction of the first polarization filter of the photodetector semiconductor component is identical to a second polarization direction of the second polarization filter of the photoemitter semiconductor component from which the electromagnetic radiation is received; and
   a sensor element for converting the electromagnetic radiation received from the second filter of the photoemitter semiconductor component into an electrical signal after the electromagnetic radiation is polarized in the first direction by the first polarization filter.

2. The photodetector semiconductor component of claim 1, wherein the first polarization filter of the photodetector semiconductor component comprises a plurality of strips which are arranged parallel to one another and at an identical distance from one another.

3. The photodetector semiconductor component of claim 2, wherein the plurality of strips is formed in a metallization plane on or above a semiconductor substrate of the photodetector semiconductor component.

4. The photodetector semiconductor component of claim 2, wherein the plurality of strips is formed in doped regions of a semiconductor substrate of the photodetector semiconductor component.

5. The photodetector semiconductor component of claim 1, wherein the sensor element is embodied as a photodiode.

6. The photodetector semiconductor component of claim 5, wherein the plurality of strips is arranged in a region of an anode of the photodiode in such a way that an electromagnetic radiation impinging on the anode is filtered by the plurality of strips.

7. The photodetector semiconductor component of claim 1, wherein the sensor element is embodied as a phototransistor.

8. The photodetector semiconductor component of claim 7, wherein the plurality of strips is arranged in a region of a base of the phototransistor in such a way that an electromagnetic radiation impinging on the base is filtered by the plurality of strips.

9. The photodetector semiconductor component of claim 1, wherein:
the first polarization filter of the photodetector semiconductor component is one polarization filter of a plurality of polarization filters of the photodetector semiconductor component,
the sensor element of the photodetector semiconductor component is a first sensor element of a plurality of sensor elements of the photodetector semiconductor component, and
a first polarization direction of the first polarization filter differs from a third polarization direction of a third polarization filter of the plurality of polarization filters.

10. The photodetector semiconductor component of claim 9, wherein the plurality of sensor elements are arranged on a carrier in a manner directly adjoining one another.

11. The photodetector semiconductor component of claim 9 wherein the plurality of sensor elements and the plurality of polarization filters are arranged in a chip housing.

12. The photodetector semiconductor component of claim 1, wherein the first polarization filter of the photodetector semiconductor component prevents an undesired interference radiation reaching the sensor element.

13. The photodetector semiconductor component of claim 12, wherein the undesired interference radiation has a third polarization direction that does not correspond to the first or second polarization directions.

14. A photoemitter semiconductor component for an optoelectronic transmission system, the photoemitter semiconductor component comprising:

a radiation source for converting an electrical signal into an electromagnetic radiation for transmission to a first polarization filter of a photodetector semiconductor component of the optoelectronic transmission system; and
a second polarization filter for filtering the electromagnetic radiation before transmission to the first polarization filter of the photodetector semiconductor component, wherein:
the second polarization filter has a second polarization direction for filtering the electromagnetic radiation before transmission to the first polarization filter of the photodetector semiconductor component; and
the second polarization direction of the second polarization filter of the photoemitter semiconductor component is identical to the first polarization direction of the first polarization filter of the photodetector semiconductor component to which the electromagnetic radiation is transmitted.

15. The photoemitter semiconductor component of claim 14, wherein the radiation source is embodied as a light-emitting diode.

16. The photoemitter semiconductor component of claim 14, wherein the second polarization filter of the photoemitter semiconductor component comprises a plurality of strips which are arranged parallel to one another and at an identical distance from one another.

17. The photoemitter semiconductor component of claim 14, wherein:
the second polarization filter of the photoemitter semiconductor component is one polarization filter of a plurality of polarization filters of the photoemitter semiconductor component,
the radiation source of the photoemitter semiconductor component is a first radiation source of a plurality of radiation sources of the photoemitter semiconductor component, and
a second polarization direction of the second polarization filter differs from a third polarization direction of a third polarization filter of the plurality of polarization filters.

18. The photoemitter semiconductor component of claim 17, wherein the plurality of radiation sources and the plurality of polarization filters are arranged in a chip housing.

19. The photoemitter semiconductor component of claim 14, wherein the second polarization direction of the second polarization filter of the photoemiter semiconductor component distinguishes the electromagnetic radiation during transmission to the first polarization filter of the photodetector semiconductor component from an interference radiation.

* * * * *